(12) United States Patent
Thurn et al.

(10) Patent No.: US 10,076,046 B2
(45) Date of Patent: Sep. 11, 2018

(54) ARRANGEMENT FOR MAKING CONTACT WITH A PRINTED CIRCUIT BOARD

(71) Applicant: ZF Friedrichshafen AG, Friedrichshafen (DE)

(72) Inventors: Hermann Thurn, Eckersdorf (DE); Hans-Jürgen Hanft, Pegnitz (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 15/505,340

(22) PCT Filed: Jul. 22, 2015

(86) PCT No.: PCT/EP2015/066693
§ 371 (c)(1),
(2) Date: Feb. 21, 2017

(87) PCT Pub. No.: WO2016/026643
PCT Pub. Date: Feb. 25, 2016

(65) Prior Publication Data
US 2017/0311459 A1    Oct. 26, 2017

(30) Foreign Application Priority Data
Aug. 22, 2014 (DE) .......................... 10 2014 216 767

(51) Int. Cl.
*H05K 5/00* (2006.01)
*H05K 5/02* (2006.01)
(Continued)

(52) U.S. Cl.
CPC ............. *H05K 5/0069* (2013.01); *H01F 5/04* (2013.01); *H01R 13/521* (2013.01);
(Continued)

(58) Field of Classification Search
CPC .... H05K 5/0069; H05K 5/0247; H05K 5/065; H05K 5/069; H01R 4/02; H01R 13/521; H01F 5/04
(Continued)

(56) References Cited

U.S. PATENT DOCUMENTS 4,288,139 A * 9/1981 Cobaugh ................ H01R 12/89
439/267
5,233,632 A * 8/1993 Baum ...................... H04B 1/30
375/344

(Continued)

FOREIGN PATENT DOCUMENTS

DE        39 36 906 A1    5/1991
DE  10 2012 221 603 A1    6/2014

OTHER PUBLICATIONS

International Search Report dated Oct. 19, 2015 in International Application No. PCT/EP2015/066693, 3 pages, German Language.
(Continued)

*Primary Examiner* — Hung S Bui
(74) *Attorney, Agent, or Firm* — Brinks Gilson & Lione

(57) ABSTRACT

The present disclosure pertains to an arrangement comprising a housing, a circuit board arranged in the housing and at least one flat contact to connect the circuit board with an electrical component arranged outside of the housing, whereby the housing has a breakthrough that the flat contact protrudes from, whereby the circuit board has breakthrough that the flat contact reaches through, that the circuit board has a contact tab on the side facing away from the housing breakthrough and whereby a molded seal is inserted in the housing breakthrough and the molded seal positively encloses the flat contact and whereby the contact tab is connected with the flat contact in an electrically conductive manner.

20 Claims, 1 Drawing Sheet

(51) Int. Cl.
*H05K 5/06* (2006.01)
*H01R 13/52* (2006.01)
*H01F 5/04* (2006.01)
*H01R 4/02* (2006.01)

(52) U.S. Cl.
CPC .......... *H05K 5/0247* (2013.01); *H05K 5/065* (2013.01); *H05K 5/069* (2013.01); *H01R 4/02* (2013.01)

(58) Field of Classification Search
USPC ........................................................ 361/757
See application file for complete search history.

(56) References Cited

U.S. PATENT DOCUMENTS

| | | | | |
|---|---|---|---|---|
| 5,437,556 A * | 8/1995 | Bargain | ............. | H01R 13/2435 439/66 |
| 5,478,244 A | 12/1995 | Maue et al. | | |
| 6,974,332 B2 * | 12/2005 | Ma | ..................... | H01R 13/2421 439/66 |
| 7,095,103 B1 * | 8/2006 | Miks | ....................... | B82Y 10/00 257/676 |
| 7,196,907 B2 * | 3/2007 | Zheng | ................. | H01R 13/2435 361/760 |
| D574,776 S * | 8/2008 | Munch | ......................... | D13/133 |
| 8,102,670 B2 * | 1/2012 | Sakamoto | .............. | H05K 1/144 361/792 |
| 2010/0091473 A1 * | 4/2010 | Kiwitt | ...................... | H01G 4/40 361/782 |
| 2014/0306785 A1 * | 10/2014 | Maier | .................. | H05K 5/0247 336/90 |

OTHER PUBLICATIONS

International Search Report dated Oct. 19, 2015 in International Application No. PCT/EP2015/066693, 2 pages, English Language.
Written Opinion of the International Search Authority dated Feb. 25, 2016 in International Application No. PCT/EP2015/066693, 4 pages, German Language.

\* cited by examiner

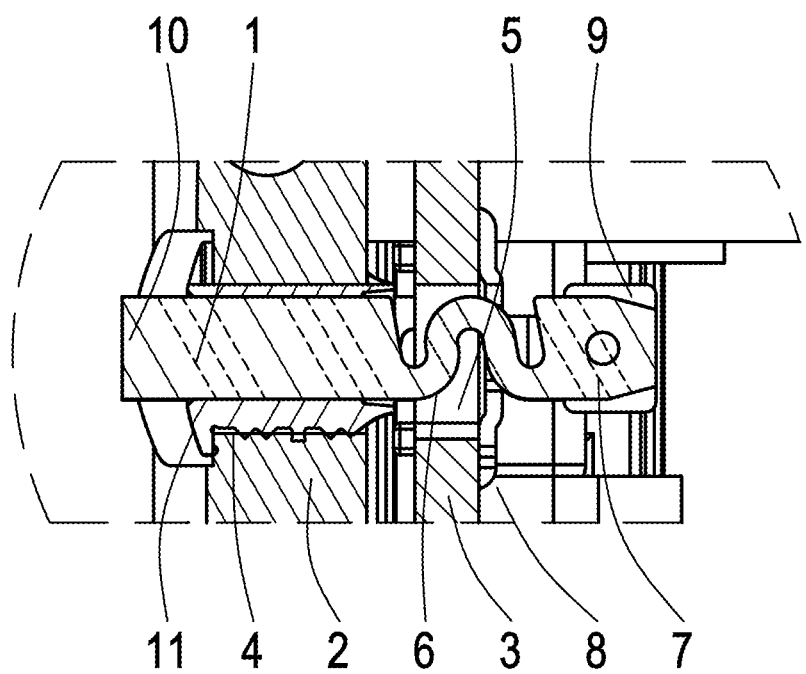

ARRANGEMENT FOR MAKING CONTACT WITH A PRINTED CIRCUIT BOARD

This application is a filing under 35 U.S.C. § 371 of International Patent Application PCT/EP2015/066693, filed Jul. 22, 2015, and claims the priority of DE 10 2014 216 767.1, filed Aug. 22, 2014. These applications are incorporated by reference herein in their entirety.

The present disclosure pertains to an arrangement comprising a housing, a circuit board arranged in the housing and at least one flat contact to connect the circuit board with an electrical component arranged outside of the housing, whereby the housing comprises a breakthrough that the flat contact protrudes from.

Circuit boards are used in drive units for motor vehicles with a combustion electric drive to control and regulate the electrical machine. These circuit boards are usually positioned in close proximity of the electric machine in the associated control units, particularly close to the coil bodies of the electrical machine. The contacting of the coil ends with the circuit board usually takes place on contact surfaces that are mounted on the circuit board. Such contact surfaces usually do not have any positioning aids, whereby the contact to be soldered can shift during the soldering process. A reliable contacting of the circuit board can thus not be ensured. At the same time it is also necessary that the circuit board is sealed media-tight, particularly watertight, to prevent that it results in short circuits due to the penetration of moisture.

It is the task of the disclosure to specify a generic arrangement, in which a circuit board is housed in a secure media-tight manner, and which enables a reliable contacting of the circuit board with electrical components outside of the arrangement.

This task is solved with the arrangement in accordance with the characteristics of the current patent claim 1. Further advantageous designs of the disclosure can be taken from the description, the patent claims, and the drawing.

The disclosure is based on an arrangement comprising a housing, a circuit board arranged in the housing and at least one flat contact to connect the circuit board with an electrical component arranged outside of the housing, whereby the housing comprises a breakthrough that the flat contact protrudes from. The electrical component may be the coil body of an electrical machine, for example. A first flat contact is thus connectable to a coil end of the coil body. A second flat contact is connectable with the other coil end of the coil body. The flat contact thus represents a direct connection between the circuit board and an electrical component.

The circuit board comprises a breakthrough that the flat contact reaches through. The flat contact is thus guided through the housing breakthrough on the one hand and then again through the breakthrough in the circuit board.

The circuit board has a contact tab on the side facing away from the housing breakthrough. This contact tab may be an SMD contact tab soldered on the circuit board by means of an SMD process, for example. The contact tab may hereby be designed to comprise a first section that is connected to the first flat contact, whereby the first flat contact is connectable with the one coil end of a coil body, and a second section that is connected with the second flat contact, whereby the second flat contact is connectable with the other coil end of a coil body. In a way familiar to the specialist, the SMD contact tab is connected with the conducting paths on or in the circuit board. It should be noted at this point that the circuit board can also be a lead frame that is completely or partially over molded with a synthetic, for example, such as thermoset or thermoplastic resin.

A molded seal is furthermore inserted in the housing breakthrough, which positively encloses the flat contact. This ensures that the housing breakthrough is closed off water tight. The molded seal can be made from rubber or another sealing material, for example. To increase the sealing function, from watertight to gastight, the housing breakthrough may also be cast. This is done after assembling the molded seal with the flat contact in the housing breakthrough and before or after the assembly of the circuit board with the contact tab with the housing.

The contact tab is furthermore connected with the flat contact on the circuit board electrically conductive, e.g. welded or soldered up.

In one embodiment, the flat contact has a meander-shaped section. This meander-shaped section is hereby formed on an end of the flat contact facing the circuit board.

The meander-formed design of the flat contact makes the production tolerances flexible, e.g. the absolute length of the flat contact. The connecting, e.g. welding of the contact tab on the circuit board with the flat contact on the contact surfaces may result in tensions during the compression with welding tongs, for example. These tensions are balanced out by the meander-shaped design of the flat contact. The forces acting on the contact surface between the flat contact and the contact tab due to an offset between the flat contact and the contact tab are also balanced out by the meander-shaped design of the flat contact. The meander shape furthermore prevents the mechanical tensions during temperature expansion (different linear expansions through different materials) in the composite.

The disclosure is subsequently further explained by means of a FIGURE. The only FIGURE schematically shows an arrangement per the disclosure in a cross-section.

A flat contact can be recognized in the only FIGURE. This flat contact 1 reaches through an opening 4 in a housing 2 and through an opening 5 in a circuit board 3. On the connection area 10 of the flat contact 1 facing away from the circuit board 3, the flat contact 1 is connected to a terminal of an electrical component (not represented). The flat contact 1 has a meander-shaped section 6 on the end of the flat contact 1 facing the circuit board 3 and is connected with a contact tab 8 attached on the circuit board 3. The flat contact 1 has a contact surface 7 in this area that the flat contact 1 is connected with a contact surface 9 of the contact tab 8.

There is a molded seal 11 in the housing breakthrough 4, which completely encloses the flat contact 1 in this area. With this molded seal 11, it is ensured that no moisture can penetrate through the housing breakthrough 4 in the direction of the circuit board 3.

REFERENCE SIGNS

1 Flat contact
2 Housing
3 Circuit board
4 Breakthrough in the housing
5 Breakthrough in the circuit board
6 Meander-shaped section
7 Contact surface on the flat contact
8 Contact tab
9 Contact surface on the contact tab
10 Connecting area of the flat contact
11 Molded seal

The invention claimed is:

1. An arrangement comprising:
   a housing,
   a circuit board arranged in the housing, and
   at least one flat contact configured to connect the circuit board with an electrical component arranged outside of the housing, wherein the housing comprises an opening through a wall of the housing that the flat contact protrudes from,
   wherein the circuit board has an opening that the flat contact is configured to protrude through,
   wherein the circuit board has a contact tab on a side facing away from the housing opening,
   wherein a molded seal is in the housing opening and the molded seal encloses the flat contact, and
   wherein the contact tab is connected with the flat contact in an electrically conductive manner.

2. The arrangement according to claim 1, wherein an end of the flat contact toward the circuit board has a meander-shaped section.

3. The arrangement according to claim 2, wherein the meander-shaped section is generally S-shaped.

4. The arrangement according to claim 2, wherein the meander-shaped section includes a one-hundred and eighty degree bend.

5. The arrangement according to claim 2, wherein the meander-shaped section has a reduced width in comparison to an end of the flat contact away from the circuit board.

6. The arrangement according to claim 2, wherein the meander-shaped section is configured to reduce tension forces created by connecting the contact tab to flat contact.

7. The arrangement according to claim 2, wherein the meander-shaped section provides flexibility to the flat contact.

8. The arrangement according to claim 1, wherein the molded seal closes the housing opening in a media-tight manner.

9. The arrangement according to claim 1, wherein the molded seal closes the housing opening in a water-tight manner.

10. The arrangement according to claim 1, wherein the contact tab is an SMD contact tab.

11. The arrangement according to claim 1, wherein the circuit board includes a conducting path, wherein the contact tab is configured to be connected to the conducting path.

12. The arrangement according to claim 1, wherein the flat contact is a first flat contact, wherein the contact tab comprises a first section and a second section, wherein the first section is configured to be connected to the first flat contact and the second section is configured to be connected to a second flat contact.

13. The arrangement according to claim 12, wherein the electrical component comprises a coil body with a first coil end and a second coil end, wherein the first flat contact is configured to be connected with the first coil end and the second flat contact is configured to be connected with the second coil end.

14. The arrangement according to claim 1, wherein the circuit board is a lead frame.

15. The arrangement according to claim 14, wherein the circuit board is at least partially over molded with a synthetic material.

16. The arrangement according to claim 15, wherein the synthetic material is thermoset or thermoplastic resin.

17. The arrangement according to claim 1, wherein the molded seal is comprised of rubber.

18. The arrangement according to claim 1, wherein the housing opening is cast.

19. The arrangement according to claim 18, wherein the molded seal closes the housing opening in a gas-tight manner.

20. A flat contact configured to connect a circuit board within a housing to an electrical component located outside of the housing, the flat contact comprising:
   a first end configured to be connected to the electrical component,
   a second end configured to be connected to the circuit board through a contact tab,
   a meander-shaped section disposed between the first end and the second end, wherein the meander-shaped section is configured to protrude through an opening in the circuit board.

* * * * *